(12) United States Patent
Liu et al.

(10) Patent No.: US 8,796,804 B2
(45) Date of Patent: Aug. 5, 2014

(54) FORMING SENSING ELEMENTS ABOVE A SEMICONDUCTOR SUBSTRATE

(75) Inventors: Ke Chun Liu, Toufen Town (TW);
Kuan-Chieh Huang, Hsin-Chu (TW);
Chin-Min Lin, Hsin-Chu (TW); Ken Wen-Chien Fu, Hsin-Chu (TW); Mingo Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1114 days.

(21) Appl. No.: 12/107,627

(22) Filed: Apr. 22, 2008

(65) Prior Publication Data

US 2009/0263674 A1    Oct. 22, 2009

(51) Int. Cl.
*H01L 31/00* (2006.01)

(52) U.S. Cl.
USPC ........... 257/459; 257/431; 257/444; 257/461; 257/E31.124

(58) Field of Classification Search
USPC ......... 257/226, 228, 233, 290, 417, 431, 444, 257/446, 448, 467, 501, 508, 758, 225, 257, 257/258, 436, 457, 458, 459, 461, 465, 257/E31.032, E31.038, E31.124
See application file for complete search history.

(56) References Cited

U.S. PATENT DOCUMENTS

| | | | |
|---|---|---|---|
| 5,512,748 A | | 4/1996 | Hanson |
| 5,936,261 A | * | 8/1999 | Ma et al. .......................... 257/59 |
| 6,215,164 B1 | * | 4/2001 | Cao et al. ....................... 257/431 |
| 6,476,374 B1 | * | 11/2002 | Kozlowski et al. ......... 250/214.1 |
| 6,709,885 B2 | * | 3/2004 | Uppal et al. ..................... 438/59 |
| 6,759,262 B2 | * | 7/2004 | Theil et al. ...................... 438/48 |
| 6,897,081 B2 | * | 5/2005 | Hsiung et al. ................... 438/48 |
| 7,101,726 B2 | * | 9/2006 | Yamamoto et al. ............. 438/69 |
| 7,193,296 B2 | * | 3/2007 | Fujita ............................ 257/620 |
| 7,288,429 B2 | * | 10/2007 | Yaung et al. .................... 438/74 |
| 7,755,158 B2 | * | 7/2010 | Lee ................................ 257/459 |
| 7,808,066 B2 | * | 10/2010 | Lee ................................ 257/443 |
| 2007/0212843 A1 | * | 9/2007 | Horiuchi ....................... 438/381 |
| 2008/0173966 A1 | * | 7/2008 | Lin ............................... 257/459 |

* cited by examiner

*Primary Examiner* — Eduardo A Rodela
(74) *Attorney, Agent, or Firm* — Slater and Matsil, L.L.P.

(57) ABSTRACT

An integrated circuit structure includes a substrate and a metallization layer over the substrate. The metallization layer includes a dielectric layer and metal lines in the dielectric layer. The integrated circuit structure further includes a sensing element over the metallization layer. The sensing element may be formed in passivation layers.

14 Claims, 10 Drawing Sheets

FORMING SENSING ELEMENTS ABOVE A SEMICONDUCTOR SUBSTRATE

TECHNICAL FIELD

This invention relates generally to sensing elements, and more particularly to integrating the sensing elements with integrated circuits.

BACKGROUND

Sensors are typically used for detecting environment parameters, such as light intensity, sound, pressure, and the like. Sensors are also widely used in imaging applications, such as infrared imaging for night vision. Existing sensors are often integrated with integrated circuits, for example, application specific integrated circuits (ASIC), which may in-situ process the sensed signals. For imaging applications, a great amount of processing may be involved. Integrating the sensors with the ASIC is thus advantageous for improving the performance.

Conventionally, image sensors that respond to photons were formed at the surface of (or even "in") semiconductor substrates. FIG. 1 illustrates a cross-sectional view of photo diodes 4 built in semiconductor substrate 2. Photo diodes 4 may be formed as an array. To suit the requirement of the ASIC, which is formed on the same semiconductor substrate 2, a plurality of metallization layers 6 (sometimes up to nine layers) are formed over photo diodes 4. Metallization layers 6 include dielectric layers, and metal lines formed in the dielectric layers. Further, passivation layer(s) 8 are formed on metallization layers 6.

For photo diodes 4 to sense photons, the photons (symbolized by arrows 10) have to penetrate the dielectric layers in metallization layers 6 and the passivation layer(s) 8. This causes the degradation in the signal strength received by photo diodes 4. Further, metallization layers 6 typically include low-k dielectric layers, and etch stop layers (ESLs) between the low-k dielectric layers. The ESL layers and low-k dielectric layers have different refractive indexes, resulting in the reflection and deflection of the photons. As a result, cross-talk occurs. For example, the non-uniformity of the ESLs and the low-k dielectric materials may cause the non-uniformity in the deflection, and hence photons 12, which are destined to photo diode $4_1$ to be received by photo diode $4_2$. The sensed image is thus distorted.

The conventional sensor formation has conflicting requirements with the formation of the ASIC. To reduce the adverse effect caused by layers 6 and 8, it is preferred that inter-layer dielectric (ILD) and inter-metal dielectrics (IMD) are as thin as possible. However, reducing the thicknesses of ILD and IMDs causes process difficulty and possible performance degradation for the ASIC, and may require customized formation processes. New methods for forming sensors are thus needed for solving the above-discussed problems.

SUMMARY OF THE INVENTION

In accordance with one aspect of the present invention, an integrated circuit structure includes a substrate; and a metallization layer over the substrate. The metallization layer includes a dielectric layer, and metal lines in the dielectric layer. The integrated circuit structure further includes a sensing element over the metallization layer. The sensing element may be formed in passivation layers.

In accordance with another aspect of the present invention, an integrated circuit structure includes a semiconductor substrate; a plurality of metallization layers over the semiconductor substrate, wherein each of the metallization layer comprises a low-k dielectric layer, and metal lines in the low-k dielectric layer; a first passivation layer over the plurality of metallization layers; and a sensing element in the first passivation layer.

In accordance with yet another aspect of the present invention, an integrated circuit structure includes a semiconductor substrate; a plurality of metallization layers over the semiconductor substrate; a first passivation layer over the plurality of metallization layers; a bond pad in the first passivation layer; an electrode in the first passivation layer, wherein the bond pad and the electrode are formed of same materials; a sensing element over and electrically connected to the electrode; and a second passivation layer over the first passivation layer. The bond pad is exposed through the second passivation layer.

The advantageous features of the present invention include improved signal strengths of sensed signals, reduced cross-talk, and reduced manufacturing cost.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming sensing elements is provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 1:
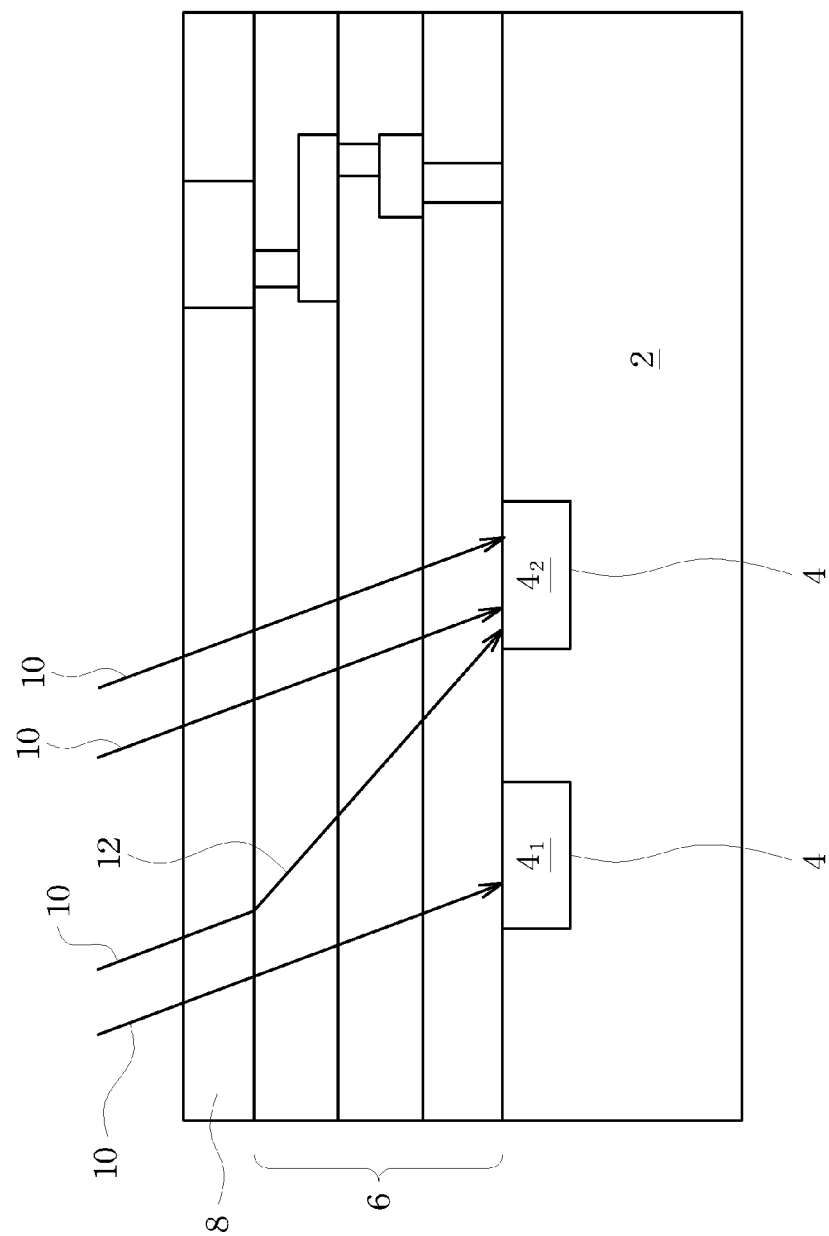
FIG. 1 illustrates a cross-sectional view of a conventional integrated circuit structure, wherein photo diodes are formed at the top surface of a semiconductor substrate.
Figure 2:
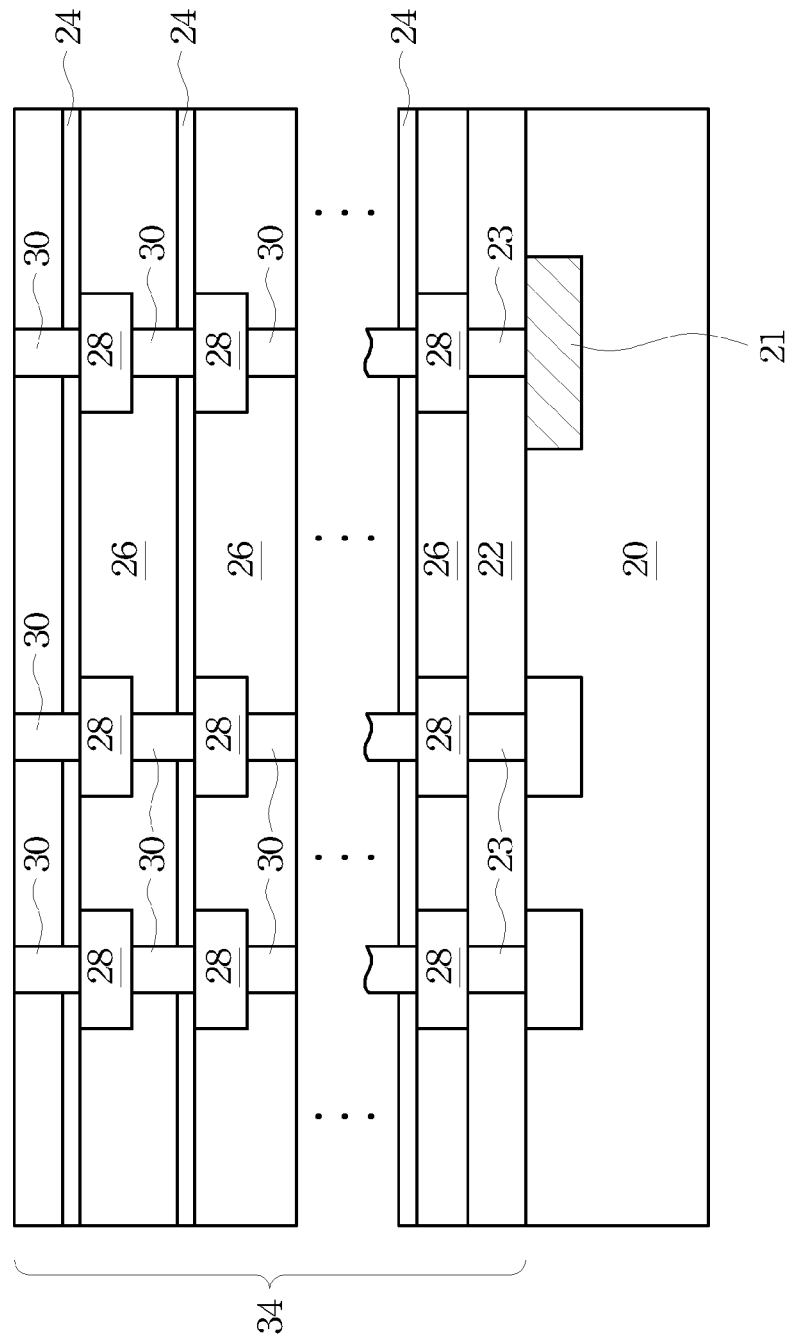
FIGS. 2 through 7B are cross-sectional views of intermediate stages in the manufacturing of an embodiment of the present invention, wherein sensing elements are formed in passivation layers.

Referring to FIG. 2, substrate 20 is provided. Substrate 20 is preferably a semiconductor substrate formed of commonly used semiconductor materials such as silicon, silicon germanium, and the like. Active and/or passive devices, such as transistors, resistors, capacitors, and the like, may be formed at the surface of substrate 20, or over substrate 20. These active/passive devices, which are symbolized by region 21, may be part of an application specific integrated circuit (ASIC).

Metallization layers 34 are formed over substrate 20. Inter-layer dielectric (ILD) layer 22 is formed under metallization layers 34, and may be formed of borophosphosilicate glass (BPSG) or other dielectric materials. Contacts 23 are formed in ILD layer 22, and connect the integrated circuits to the overlying metallization layers 34. Inter-metal dielectrics (IMD) layers 26 are formed over ILD layer 22, and may be formed of low-k dielectric materials, for example, with dielectric constants (k value) less than about 3.9. IMD layers 26 may also be formed of extra low-k (ELK) dielectric materials, which may have k values of less than about 2.5. Exemplary materials include carbon-containing low-k dielectric materials, which may further include silicon, oxygen, nitrogen, and combinations thereof. The number of IMD layers 26 depends on the complexity of the application, and may range from two to nine layers. Etch stop layers 24 separate IMD layers 26 from each other. Etch stop layers 24 may be formed of dielectric materials having greater k values than IMD layers 26.

Metal lines 28 and vias 30 are formed in dielectric layers 22 and 26, and are used to interconnect integrated circuits formed on substrate 20, and to connect the subsequently formed sensing elements to the integrated circuits. Metal lines 28 and vias 30 may be formed using damascene processes. The formation of dielectric layers 22 and 26, metal lines 28, and vias 30 are known in the art, and hence are not repeated herein.

Figure 3:
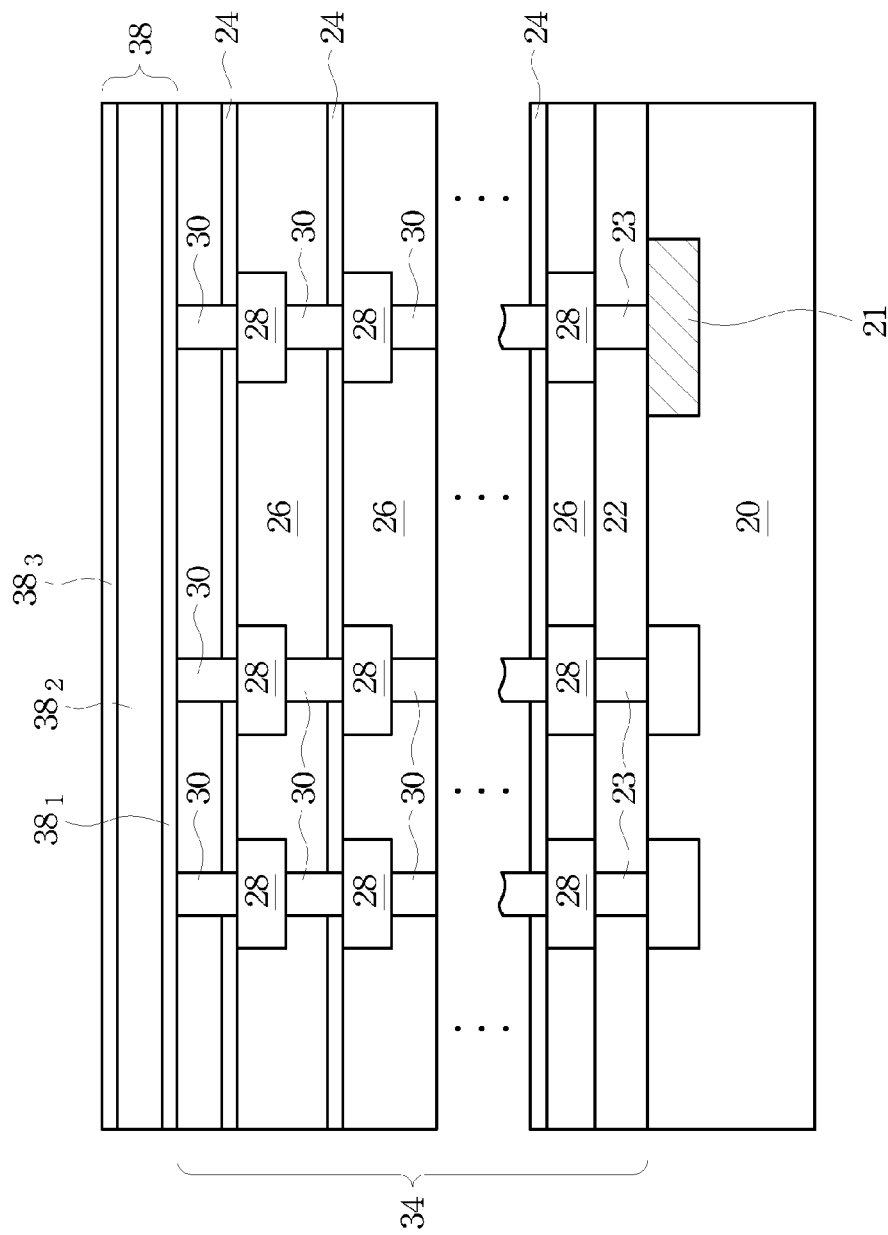

Referring to FIG. 3, electrode layer 38 is formed over metallization layers 34, and is electrically connected to metal lines 28 and vias 30. Electrode layer 38 may include layer $38_2$ and barrier/adhesion layers $38_1$ and/or $38_3$, which are preferably formed of titanium, titanium nitride, tantalum, tantalum nitride, or the like. Layer $38_2$ may be formed of aluminum, copper, tungsten, or alloys thereof.

Figure 4:
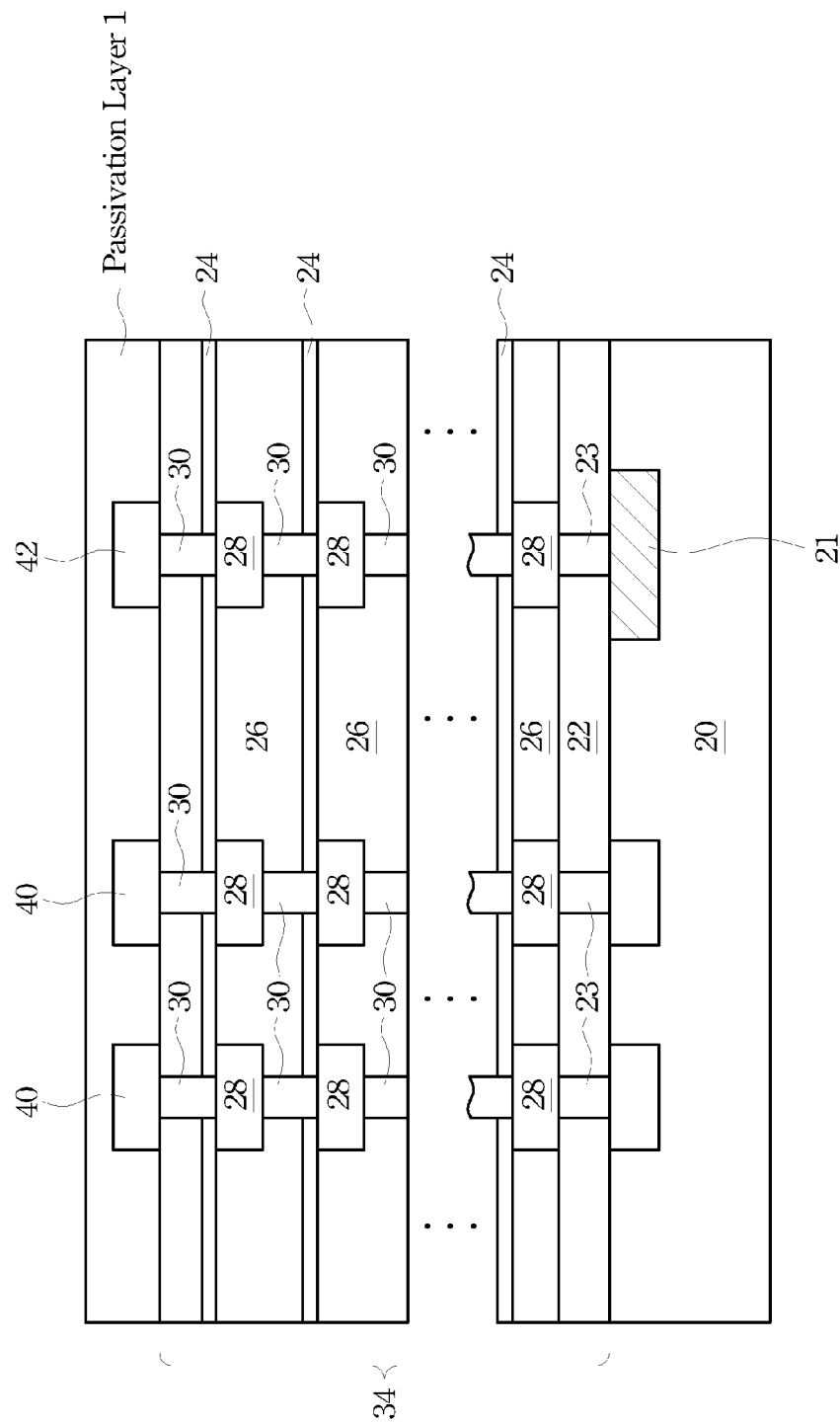

Next, as shown in FIG. 4, electrode layer 38 is patterned to form electrodes 40 and bond pad 42. Preferably, each of the electrodes 40 and bond pad 42 is electrically connected to underlying features such as metal lines 28. A passivation layer (referred to as passivation layer 1 hereinafter) is then formed. In an embodiment, passivation layer 1 is formed of silicon oxide, although it may also be formed of un-doped silicate glass (USG), or other commonly used dielectric materials having higher k values and greater mechanical strengths than the underlying IMD layers 26 and ILD layer 22. A chemical mechanical polish is then performed to level the top surface of passivation layer 1.

Figure 5:
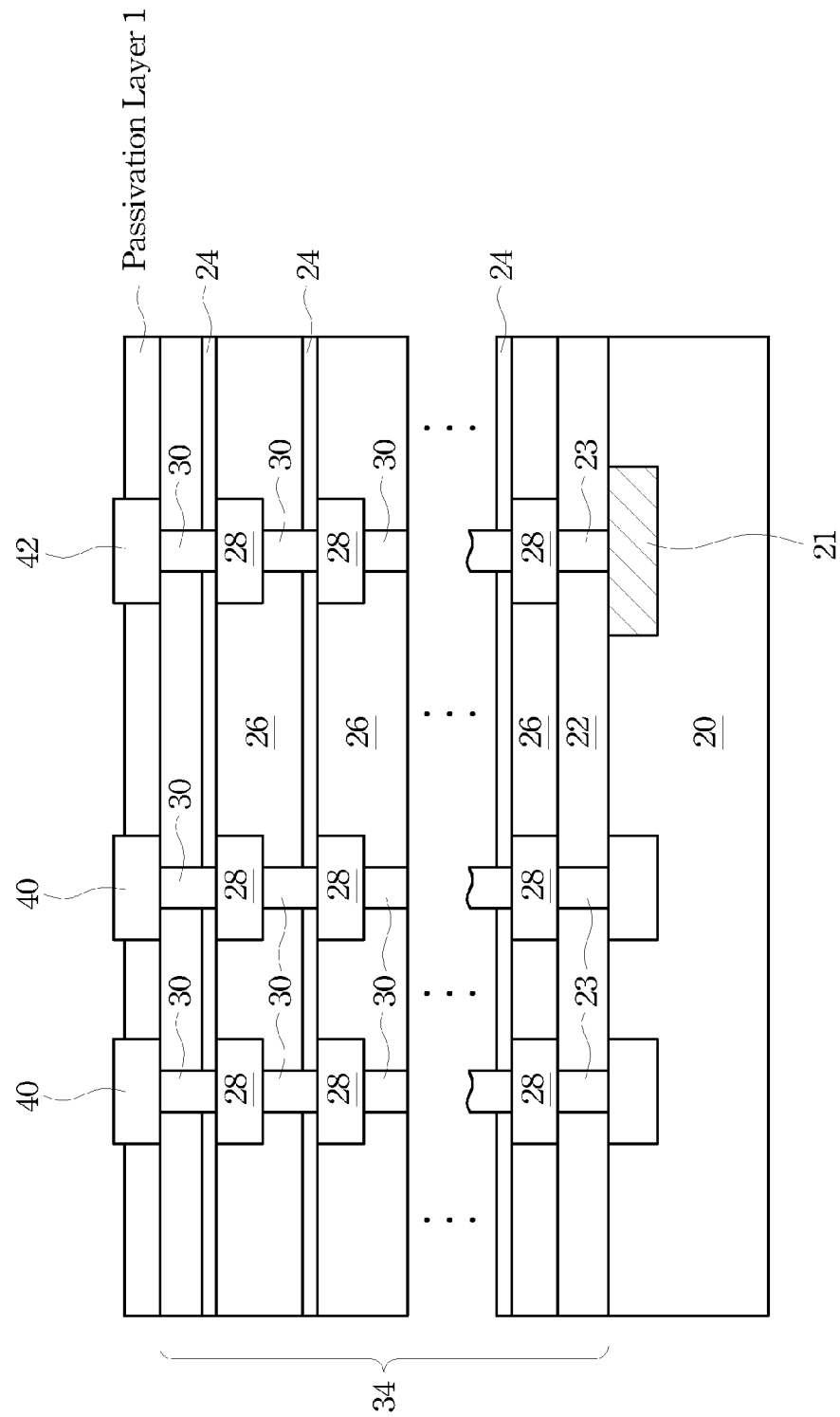
Figure 6:
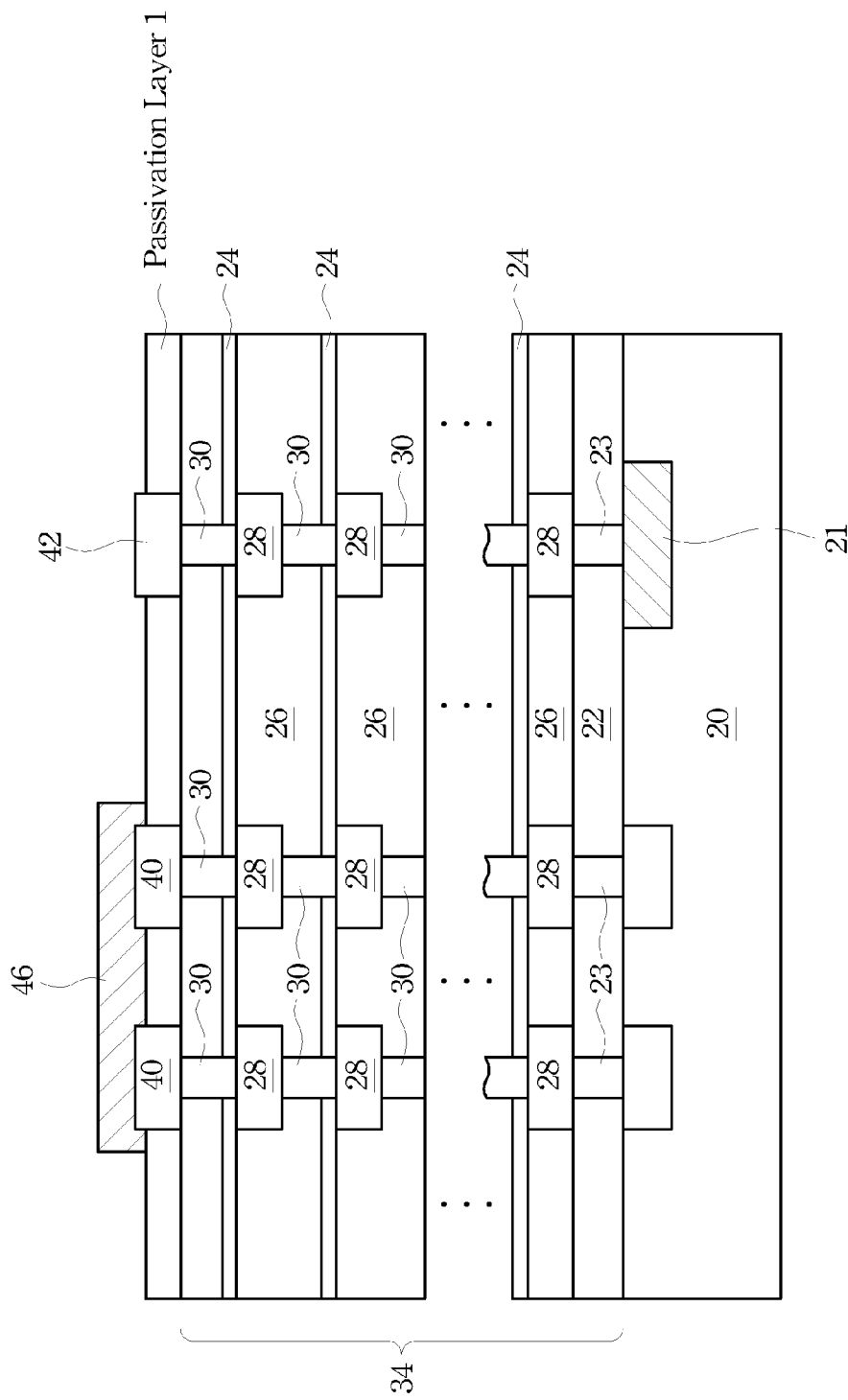

Referring to FIG. 5, passivation layer 1 is etched back, exposing electrodes 40 and bond pad 42. Preferably, an over-etch is performed, so that top portions of electrodes 40 are above the top surface of the remaining passivation layer 1. Sensing element 46 is then formed, as is shown in FIG. 6. The formation of sensing element 46 may include blanket depositing a sensing material layer, and then patterning the sensing material layer. In an embodiment, sensing element 46 is connected to two electrodes 40. In other embodiments, sensing element 46 is connected to only one electrode 40. Through electrodes 40 and underlying metal lines 28 and vias 30, sensing element 46 may be connected to the integrated circuits on substrate 20.

Sensing element 46 may be used for sensing light intensity (photons), and hence may be referred to as image sensor 46. Sensing element 46 may also be used for sensing other environment parameters, such as pressure, sound, temperature, and the like. The materials, shapes, and dimensions are thus determined according to the intended purpose. For example, the dimensions of sensing element 46 are preferably greater than the wavelength of the sound or light to be sensed. The applicable materials of sensing element 46 include polymers, resins, or other compound materials. These materials are capable of generating different numbers of electrons (which result in the desirable electrical signal) when the external environments, such as the light intensity, the pressure, or the like, change. Through electrodes 40 and underlying metal lines 28 and via 30, the electrical signals are transferred to the integrated circuit for further processing. In an exemplary embodiment in which light is to be sensed, sensing element 46 is formed of PbS.

Figure 7A:
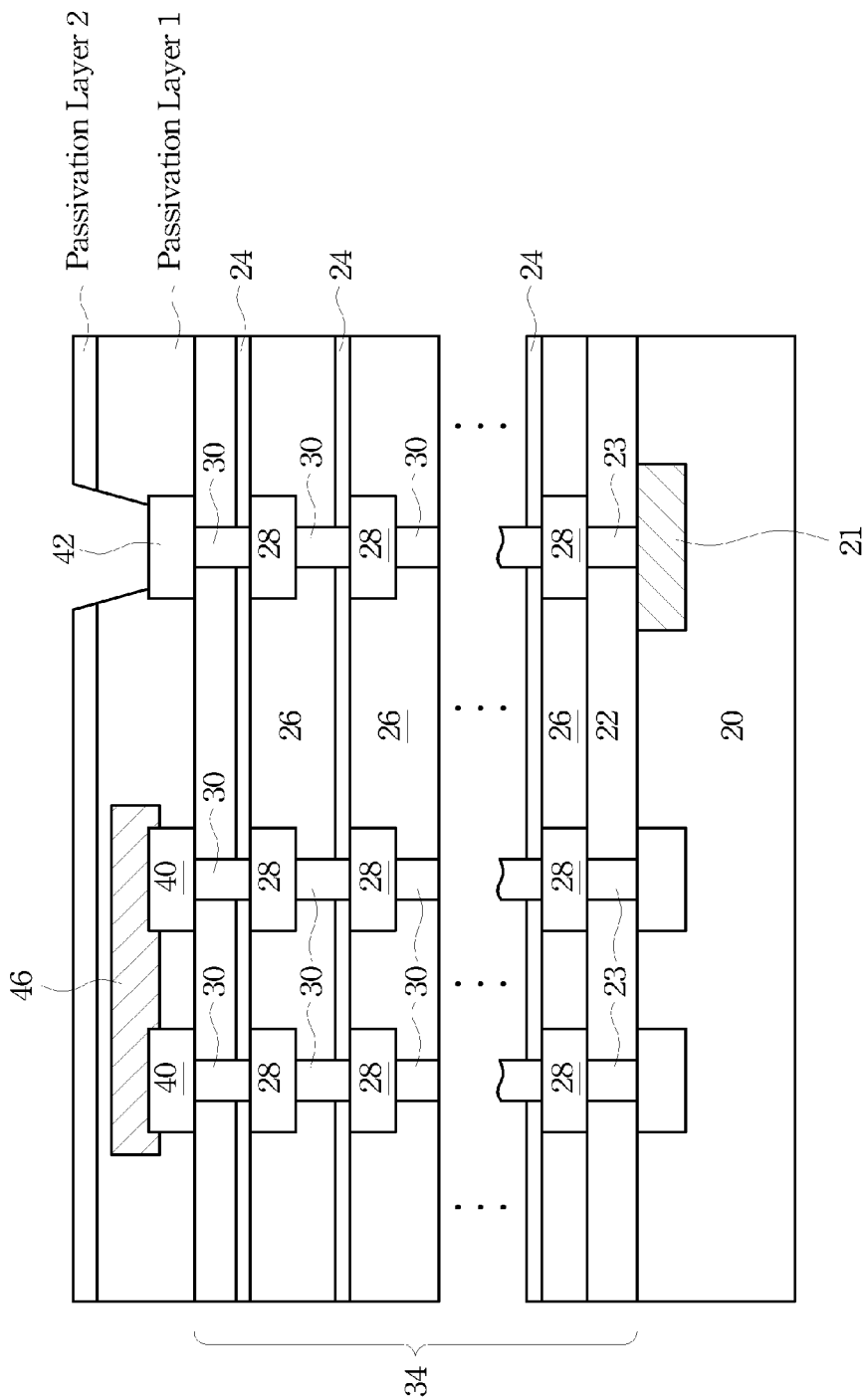
Figure 7B:
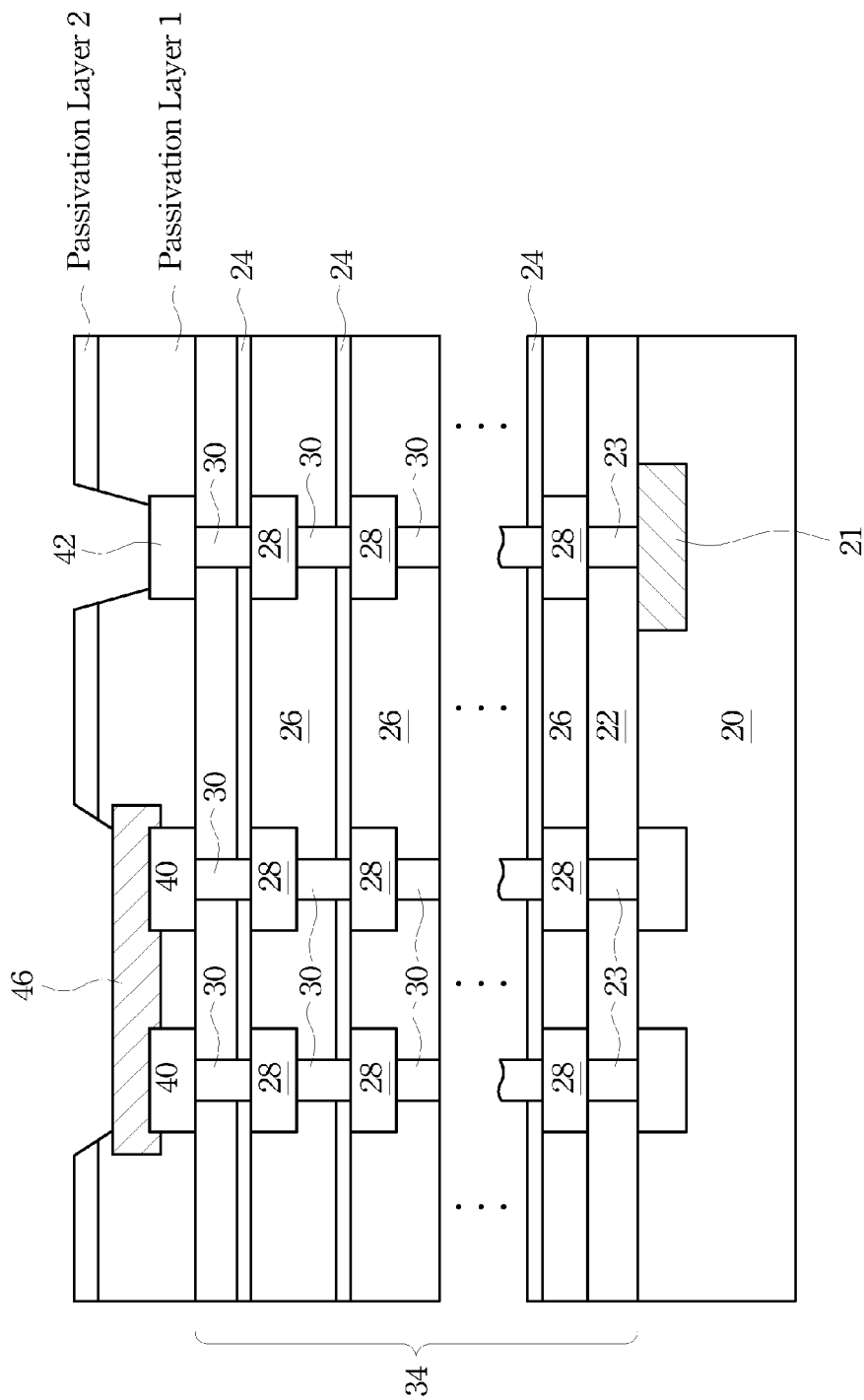

FIGS. 7A and 7B illustrate the continued formation of passivation layers. In an embodiment, passivation layer 1 is continually formed to cover sensing element 46 and bond pad 42. An additional passivation layer (referred to as passivation layer 2 hereinafter) is then formed on passivation layer 1. Passivation layer 2 is preferably formed of a different material than that of passivation layer 1. Exemplary materials include silicon nitride and USG. However, other commonly used passivation materials may also be used. In alternative embodiments, only one passivation layer is formed, and after passivation layer 1 covers sensing element 46 and bond pad 42, no further passivation layer is formed.

FIG. 7A illustrates an embodiment of the present invention. Passivation layers 1 and 2 are etched to expose bond pad 42. Sensing element 46 remains covered by passivation layers 1 and 2. The covered sensing element 46 is functional for receiving photons, which only need to penetrate the passivation layers 1 and 2 before they are sensed by sensing element 46. Compared to the conventional scheme in which sensing elements are formed under metallization layers 34, the signal received by sensing element 46 is stronger. In addition, the photons only need to pass at most one interface between different materials (in this case, between passivation layers 1 and 2), and hence the reflection and deflection of the photons are reduced. As a result, the signal cross-talk is reduced. In alternative embodiments in which pressure, sound, or the like are to be sensed, sensing element 46 is preferably exposed through passivation layers 1 and 2, as is shown in FIG. 7B. In this embodiment, the portions of passivation layers 1 and 2 covering sensing element 46 are removed simultaneously with the removal of the portion of passivation layers 1 and 2 over bond pad 42.

Figure 8:
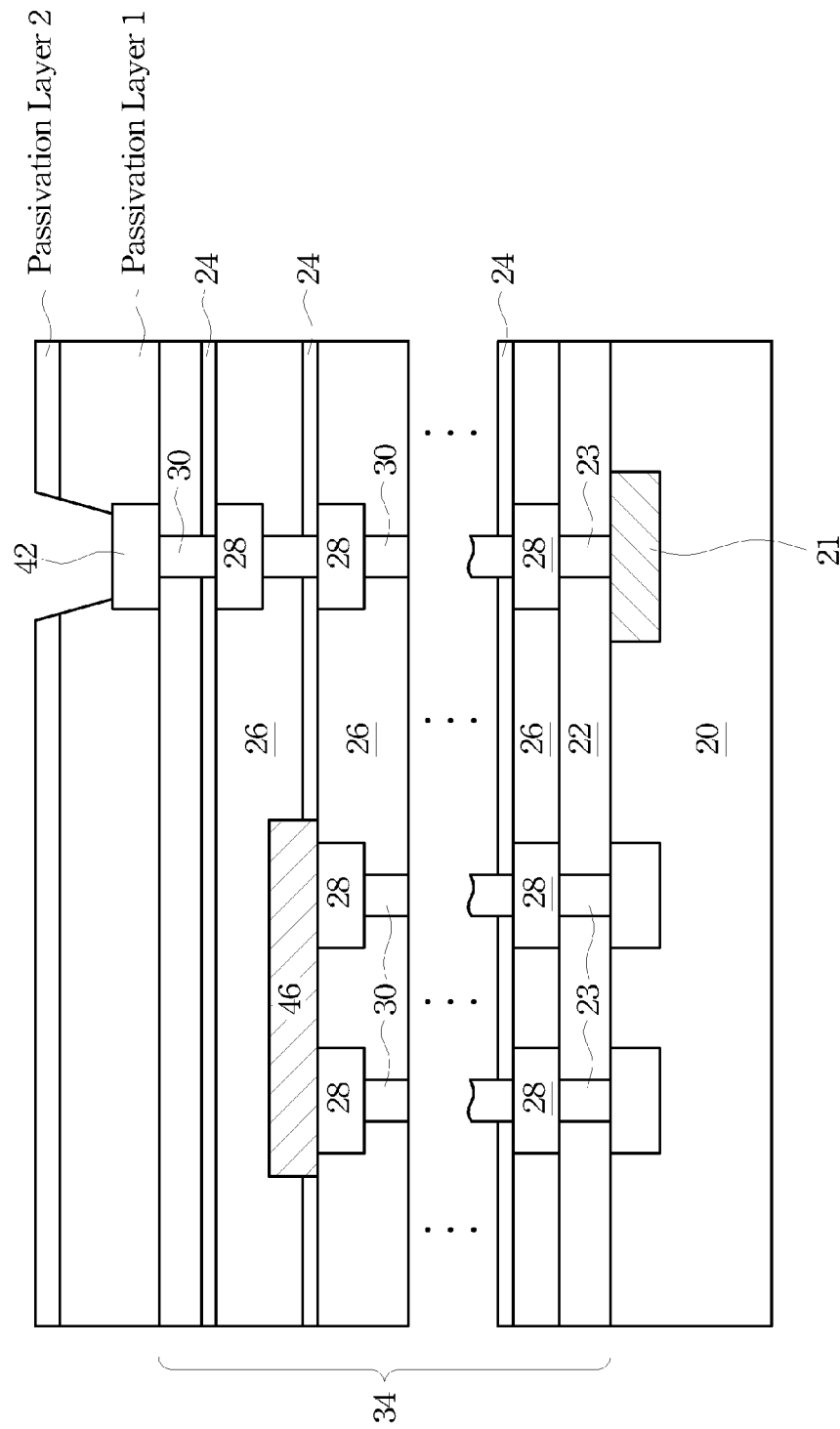
FIG. 8 illustrates an alternative embodiment of the present invention, wherein a sensing element is formed between an inter-layer dielectric and the passivation layers.

FIG. 8 illustrates an alternative embodiment of the present invention, in which sensing element 46 is formed under passivation layer 1, and in a layer between passivation layer 1 and ILD 22. Although compared to the embodiment shown in FIG. 7A, photons need to penetrate more dielectric layers before they can reach sensing element, the result is still better than forming sensing element 46 underlying ILD 22.

Figure 9:
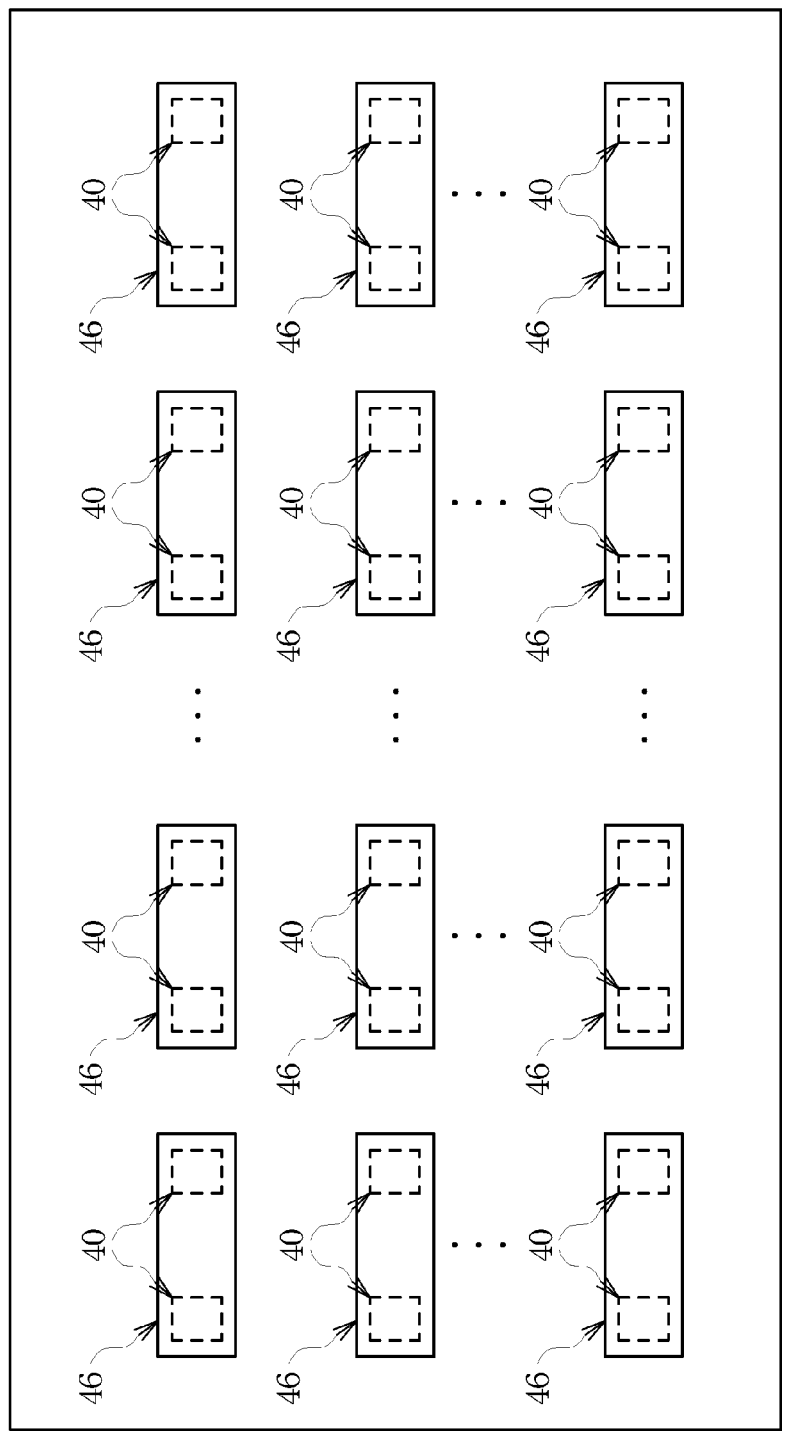
FIG. 9 illustrates a top view of a sensing element array.

A semiconductor chip may include a plurality of sensing elements 46. FIG. 9 illustrates a top view f semiconductor chip 50, which includes an array of sensing elements 46, wherein each of the sensing elements 46 may have essentially the same structure as shown in FIG. 7A or 7B, and may be formed using essentially the same method as discussed in the preceding paragraphs.

The embodiments of the present invention have several advantageous features. By forming the sensing elements closer to the top surface of semiconductor chips, the signals received by the sensing elements are improved. For image sensors, the cross-talk is reduced since photons are less likely to be reflected and deflected with fewer layers for them to penetrate. Other sensors such as sound or pressure sensors may be conveniently exposed through the top surface of the respective semiconductor chip, resulting in improved performance and reduced manufacturing cost. For ASIC applications, there is no longer the concern for reducing the thicknesses of ILD and IMDs.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a substrate;
   an inter-layer dielectric layer;
   a plurality of inter-metal dielectric layers over the inter-layer dielectric layer;
   a first passivation layer over the plurality of inter-metal dielectric layers, wherein the first passivation layer is formed of a homogenous dielectric material;
   a first opening in the first passivation layer;
   a sensing element configured to sense photons received from over the sensing element, wherein the sensing element is exposed through the first opening, wherein the sensing element is a single sensing element separated from remaining sensing elements over the substrate, wherein the first passivation layer comprises a first portion overlapping edge portions of the sensing element, and a second portion encircling and contacting edges of the sensing element; and
   a first electrode and a second electrode underlying and in contact with the sensing element.

2. The integrated circuit structure of claim 1, wherein the plurality of inter-metal dielectric layers comprises a low-k dielectric layer.

3. The integrated circuit structure of claim 1 further comprising:
   a bond pad encircled by a third portion of the first passivation layer, with edges of the bond pad contacting the third portion of the first passivation layer, wherein a top surface of the bond pad and a top surface of the first electrode are coplanar, and wherein a bottom surface of the bond pad and a bottom surface of the first electrode are coplanar;
   a second passivation layer over the bond pad; and
   a second opening in the first passivation layer and the second passivation layer, wherein the bond pad is exposed through the second opening.

4. The integrated circuit structure of claim 3, wherein the first opening extends into the second passivation layer, and wherein the sensing element is exposed through the first opening in the second passivation layer.

5. The integrated circuit structure of claim 1, wherein no dielectric material is filled in the first opening.

6. The integrated circuit structure of claim 1 further comprising active devices at a top surface of the substrate.

7. The integrated circuit structure of claim 1, wherein the first electrode comprises a metal.

8. An integrated circuit structure comprising:
   a semiconductor substrate;
   a plurality of metallization layers over the semiconductor substrate;
   a first passivation layer over the plurality of metallization layers, wherein an entirety of the first passivation layer is formed of a same homogenous material;
   a bond pad in the first passivation layer;
   a first electrode and a second electrode in the first passivation layer, wherein a bottom surface of the bond pad and a bottom surface of the first electrode are coplanar, and wherein the bond pad and the first electrode are formed of same materials;
   a sensing element configured to sense photons over and contacting the first electrode and the second electrode, wherein the sensing element is a single sensing element separated from other sensing elements that are over the semiconductor substrate, wherein the sensing element is in the first passivation layer, and comprising a top surface lower than a top surface of the first passivation layer, and a bottom surface higher than a bottom surface of the first passivation layer; and
   a second passivation layer over the first passivation layer, wherein the bond pad is exposed through the second passivation layer.

9. The integrated circuit structure of claim 8, wherein the first passivation layer and the second passivation layer are formed of different materials.

10. The integrated circuit structure of claim 9, wherein the first passivation layer comprises silicon oxide, and the second passivation layer comprises silicon nitride.

11. The integrated circuit structure of claim 8 further comprising an opening extending from a top surface of the second passivation layer into the first passivation layer, wherein the sensing element is exposed through the opening.

12. The integrated circuit structure of claim 8, wherein the plurality of metallization layers comprises a plurality of low-k dielectric layers, and wherein the first and the second passivation layers have k values greater than k values of the plurality of low-k dielectric layers.

13. The integrated circuit structure of claim 8, wherein the sensing element is in a sensing element array comprising a plurality of sensing elements.

14. The integrated circuit structure of claim 8, where the first electrode is in a bottom portion of the first passivation layer.

* * * * *